(12) United States Patent
Jeng et al.

(10) Patent No.: US 11,145,149 B2
(45) Date of Patent: Oct. 12, 2021

(54) ELECTRONIC LOCK

(71) Applicant: TONG LUNG METAL INDUSTRY CO., LTD., Minsyong Township, Chiayi County (TW)

(72) Inventors: Ruei-Jie Jeng, Jhuci Township, Chiayi County (TW); Chun-Yi Fang, Huwei Township, Yunlin County (TW); Chen-Ming Lin, Minsyong Township, Chiayi County (TW); Chih-Han Wu, Minsyong Township, Chiayi County (TW)

(73) Assignee: TONG LUNG METAL INDUSTRY CO., LTD., Minsyong Township, Chiayi County (TW)

( * ) Notice: Subject to any disclaimer, the term of this patent is extended or adjusted under 35 U.S.C. 154(b) by 0 days.

(21) Appl. No.: 16/998,441

(22) Filed: Aug. 20, 2020

(65) Prior Publication Data

US 2021/0056787 A1 Feb. 25, 2021

(30) Foreign Application Priority Data

Aug. 21, 2019 (TW) ................................. 108129853
Aug. 21, 2019 (TW) ................................. 108129854
Aug. 21, 2019 (TW) ................................. 108129855

(51) Int. Cl.
*G07C 9/00* (2020.01)
*G06F 3/044* (2006.01)

(52) U.S. Cl.
CPC ......... *G07C 9/00571* (2013.01); *G06F 3/044* (2013.01); *G07C 9/00698* (2013.01)

(58) Field of Classification Search
CPC ...................................................... G07C 9/00
See application file for complete search history.

*Primary Examiner* — K. Wong
(74) *Attorney, Agent, or Firm* — Muncy, Geissler, Olds & Lowe, P.C.

(57) ABSTRACT

An electronic lock includes an electric locking unit, a touch panel, and a control module. The control module stores a plurality of touch condition sets which are related to human contact. The control module executes an input scan operation on each touch switch of the touch panel, charges a self capacitor with a scan signal, and charges a mutual capacitor with a driving signal. The control module determines whether an electric change conforms with any one of the touch conditions. Through a structural design of the touch panel and a scan function design of the control module, the electronic lock can more accurately determine whether the touch panel is operated by human touch and can also normally operate in a humid environment.

19 Claims, 3 Drawing Sheets

ELECTRONIC LOCK

CROSS-REFERENCE TO RELATED APPLICATION

This application claims priorities to Taiwanese Invention Patent Application Nos. 108129853, 108129854, and 108129855, all filed on Aug. 21, 2019.

FIELD

The disclosure relates to a lock, and more particularly to an electronic lock.

BACKGROUND

Unlike a traditional lock which needs a physical key to unlock or lock a door, the issue that comes with forgetting to bring a key is non-existent for an electronic lock which operates without a physical key. In addition, many electronic locks come with a function of communicating with home networks or mobile devices. Therefore, electronic locks have been used in most new construction projects. Among the different types of electronic locks, touch-sensitive electronic locks are relatively more popular. A conventional touch-sensitive electronic lock includes a capacitive touch panel that serves as an input interface, that is less prone to damage and that is similar to a general mobile device (e.g., a smart phone) in terms of touch operation.

Generally, the capacitive touch panel includes a circuit board and a plurality of touch contacts disposed on the circuit board, and detects, with respect to each of the touch contacts, the change in coupling capacitance between the touch contact and a reference ground of the circuit board to determine whether the touch contact is being touched or not. Since most of the human body is water, which has a relatively great dielectric constant, contact of a human body with the touch contact will cause a significant change in the coupling capacitance between the touch contact and the reference ground.

However, the structural design of the capacitive touch panel currently applied in the conventional touch-sensitive electronic locks has a problem that the capacitive touch panel may be accidentally triggered and activated by water because the capacitive touch panel is designed with earth wires respectively around the touch contacts for reducing the interference of background noise to the touch contacts. This structural design makes the capacitive touch panel responsive to the contact of water droplets, much similar to its response to human contact.

When water droplets come into contact with the touch contact, they will not only produce capacitive coupling with one of the touch contacts, but also produce relatively strong capacitive coupling with the corresponding one of the earth wires. This strong capacitive coupling will increase the coupling capacitance between the touch contact and the reference ground of the circuit board, causing the capacitive touch panel to produce a reaction signal, similar to the human touch operation. Therefore, a control circuit of the conventional touch-sensitive electronic lock will be triggered by this reaction signal and will switch from a sleep mode to an operation mode. When the electronic lock is unintentionally triggered owing to high humidity or rainwater, power consumption of the conventional touch-sensitive electronic lock would increase and sometimes even an incorrect operation of the conventional touch-sensitive electronic lock may be triggered.

SUMMARY

Therefore, an object of the disclosure is to provide an electronic lock that can alleviate at least one of the drawbacks of the prior art.

According to one aspect of the disclosure, the electronic lock includes an electric locking unit, a touch panel and a control module.

The touch panel includes a circuit board that has a reference ground, a plurality of touch switches that are disposed on the circuit board, and a shielding circuit that is disposed on the circuit board around the touch switches for shielding the touch switches from the reference ground of the circuit board.

The control module includes a scan control unit and a lock control unit.

The scan control unit is configured to store a plurality of touch condition sets which are related to human contact and which correspond respectively to the touch switches. Each of the touch condition sets includes a plurality of touch conditions that are pre-established respectively in different weather conditions. The scan control unit is further configured to operate in an operation mode to repeatedly execute an input scan operation on the touch panel. In each time of execution of the input scan operation, the scan control unit scans each of the touch switches individually by: transmitting a scan signal to the touch switch to charge a self capacitor formed by coupling between the touch switch and the reference ground of the circuit board; transmitting a driving signal to the shielding circuit to charge a mutual capacitor formed by coupling between the shielding circuit and the touch switch; determining whether an electric change relating to the self capacitor and the mutual capacitor conforms with any one of the touch conditions included in the corresponding one of the touch condition sets; and generating a touch signal corresponding to the touch switch when it is determined that the electric change conforms with one of the touch conditions in the corresponding one of the touch condition sets.

The lock control unit is configured to store a reference password, to receive the touch signal from the scan control unit, to compose an input password based on a plurality of the touch signals that are generated respectively in different times of execution of the input scan operation, to determine whether the input password is identical to the reference password, and to control the electric locking unit to operate when it is determined that the input password is identical to the reference password.

According to another aspect of the disclosure, an electronic lock includes an electric locking unit, a touch panel and a control module.

The touch panel includes a circuit board that has a reference ground, a plurality of touch switches that are disposed on the circuit board, and a shielding circuit that is disposed on the circuit board around the touch switches for shielding the touch switches from the reference ground of the circuit board.

The control module includes a scan control unit that is configured to store a plurality of touch condition sets which are related to human contact and which correspond respectively to the touch switches. Each of the touch condition sets includes a plurality of touch conditions that are pre-established respectively in different weather conditions. The control module is further configured to operate in one of an operation mode where the control module is configured to control the electric locking unit to operate, and a sleep mode where the scan control unit executes an intermittent scan operation once every predetermined time interval.

In each time of execution of the intermittent scan operation, the scan control unit scans each of the touch switches individually by: transmitting a constant current signal to the touch switch to charge a self capacitor formed by coupling between the touch switch and the reference ground of the circuit board for a predetermined time duration in a manner that the self capacitor remains undercharged; transmitting a driving signal to the shielding circuit to charge a mutual capacitor formed by coupling between the shielding circuit and the touch switch to make a high voltage level of a voltage of the mutual capacitor greater than a voltage of the self capacitor; determining whether an electric change relating to the self capacitor and the mutual capacitor conforms with any one of the touch conditions included in the corresponding one of the touch condition sets; and switching to the operation mode when it is determined in the sleep mode that the electric change conforms with one of the touch conditions in the corresponding one of the touch condition sets.

According to another aspect of the disclosure, an electronic lock includes an electric locking unit, a touch panel and a control module.

The touch panel includes a circuit board that has a reference ground, a plurality of touch switches that are disposed on the circuit board, and a shielding circuit that is disposed on the circuit board around the touch switches for shielding the touch switches from the reference ground of the circuit board.

The control module includes a scan control unit that is configured to store a plurality of touch conditions which are related to human contact and which correspond respectively to the touch switches. Each of the touch condition sets includes a plurality of touch conditions that are pre-established respectively in different weather conditions. The control module is further configured to operate in one of an operation mode where the control module is configured to control the electric locking unit to operate, and a sleep mode where the scan control unit executes an intermittent scan operation once every predetermined time interval.

In each time of execution of the intermittent scan operation, the scan control unit scans each of the touch switches individually by: transmitting a scan signal to the touch switch to charge a self capacitor formed by coupling between the touch switch and the reference ground of the circuit board so as to make a voltage of the self capacitor reach a predetermined voltage value; transmitting a driving signal to the shielding circuit to charge a mutual capacitor formed by coupling between the shielding circuit and the touch switch so as to make a voltage of the mutual capacitor equal to the voltage of the self capacitor; determining whether an electric change relating to the self capacitor and the mutual capacitor conforms with any one of the touch conditions included in the corresponding one of the touch condition sets; and switching to the operation mode when it is determined in the sleep mode that the electric change conforms with one of the touch conditions in the corresponding one of the touch condition sets.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
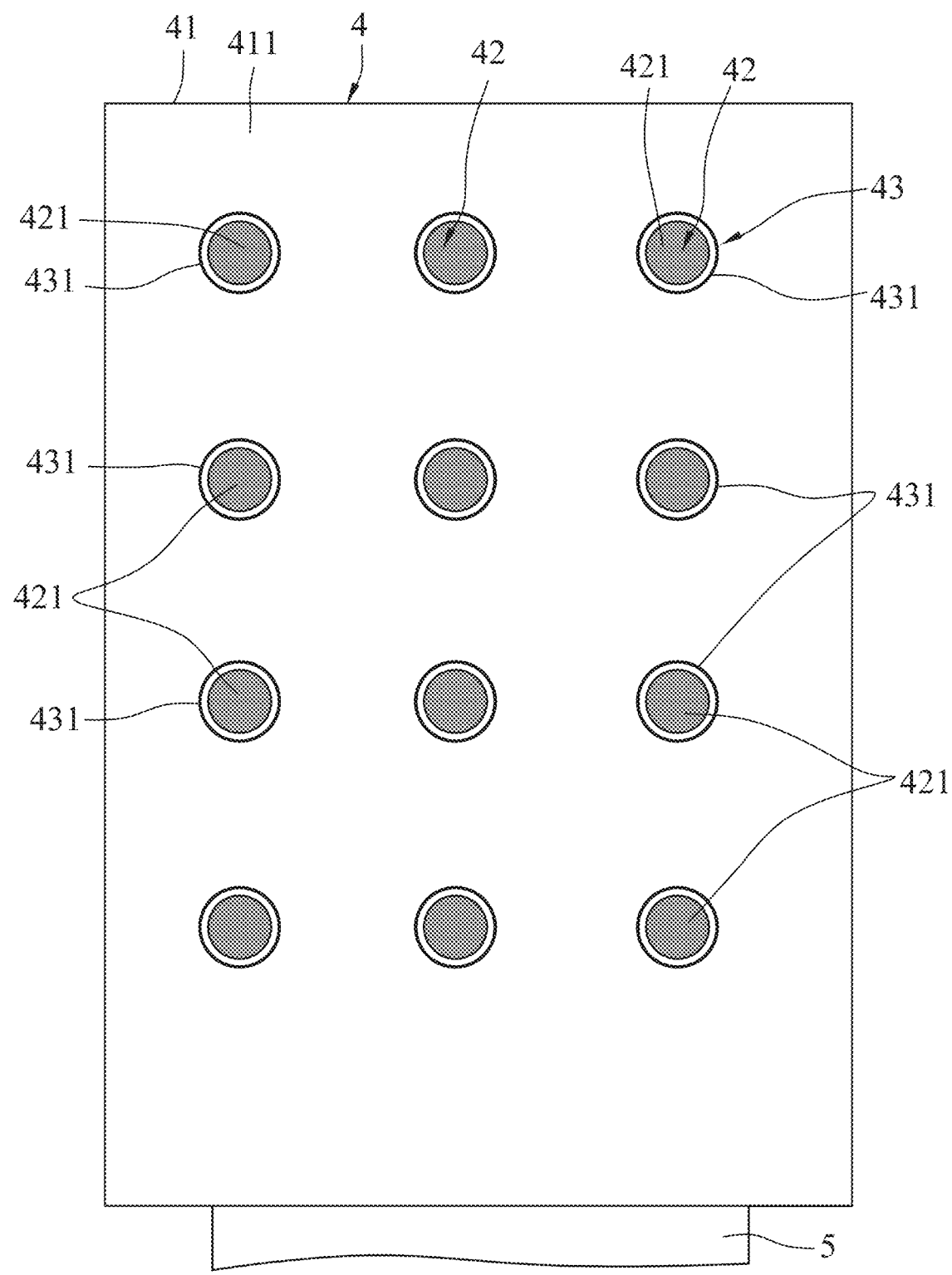
FIG. 1 is a schematic front view of a touch panel of the electronic lock according to an embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
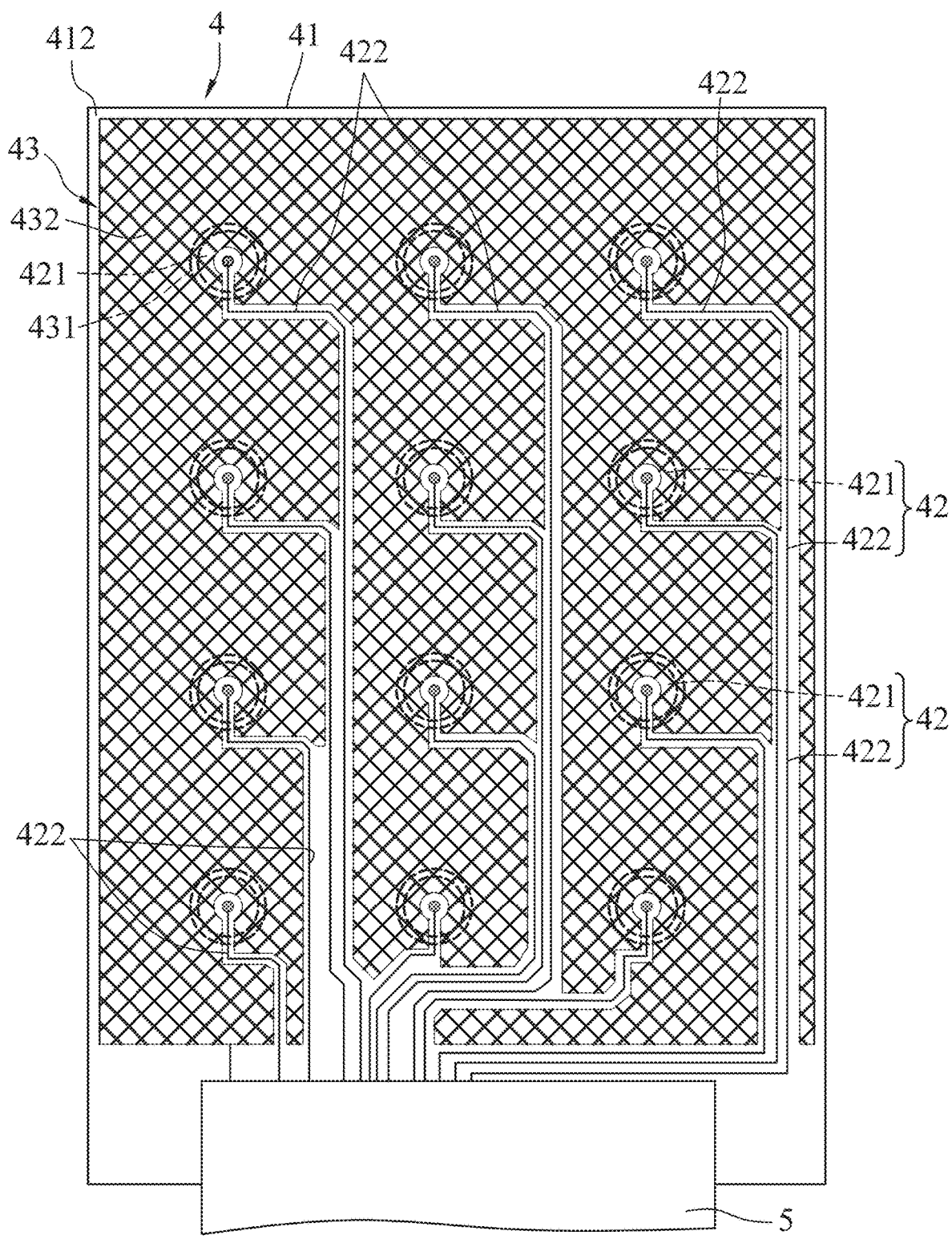
FIG. 2 is a schematic rear view of the touch panel of the electronic lock according to an embodiment of the disclosure.
Figure 3:
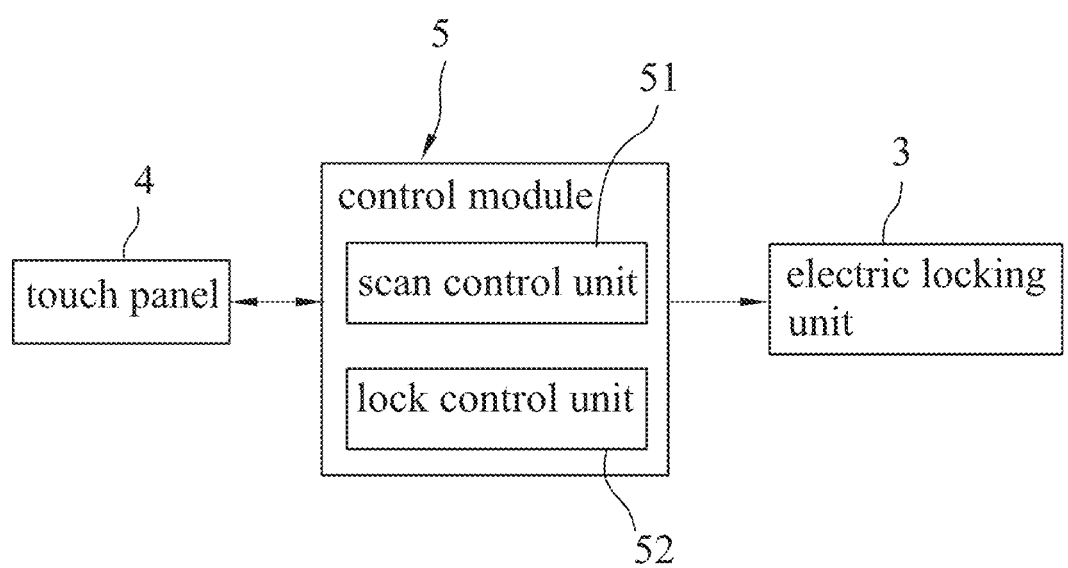
FIG. 3 is a block diagram of the electronic lock according to an embodiment of the disclosure.

Referring to FIGS. 1 to 3, an embodiment of an electronic lock includes an electric locking unit 3 that can be controlled to switch between an unlocked state and a locked state, a touch panel 4 for a user to enter a password by touch operation, and a control module 5 that is electrically connected to the electric locking unit 3 and the touch panel 4.

For example, the electric locking unit 3 includes a motor (not shown) controlled by the control module 5, and a bolt (not shown) to be driven by the motor to move. There are many different types of electric locking units; since the electric locking unit 3 is not the main feature of this disclosure, the electric locking unit 3 will not be described in detail herein.

The touch panel 4 is a capacitive touch panel, and includes a circuit board 41, a plurality of touch switches 42 disposed on the circuit board 41, and a shielding circuit 43 around the touch switches 42 for shielding the touch switches 42 from a reference ground of the circuit board 41. The circuit board 41 has a front side 411 and a rear side 412 opposite to the front side 411. It is noteworthy that the touch panel 4 further includes an insulating cover layer (not shown) disposed on the front side 411 of the circuit board 41, as well as other components generally included in capacitive touch panels Since general components of a capacitive touch panel are not key features of this disclosure, the following will only focus on the design of the touch switches 42 and the shielding circuit 43.

Each of the touch switches 42 includes a touch contact 421 and a conducting wire 422. The touch contact 421 is disposed on the front side 411 of the circuit board 41 for detecting touch operation by, e.g., a human body, and the conducting wire 422 is disposed on the rear side 412 of the circuit board 41. In this embodiment, the touch contact 421 is substantially in the form of a flat plate. The conducting wire 422 electrically connects the touch contact 421 to the control module 5. Specifically, one end of the conducting wire 422 is electrically connected to the touch contact 421, and the other end of the conducting wire 422 is opposite to the touch contact 421 and is electrically connected to the control module 5. Since creating the electrical connection between the conducting wire 422 and the touch contact 421 that are disposed respectively on opposite sides of the circuit board 41 is a conventional technique, details thereof will be omitted herein for the sake of brevity. The touch contacts 421 respectively of the touch switches 42 are disposed respectively at different portions of the front side 411.

The shielding circuit 43 includes a plurality of shielding rings 431 and a rear shielding plate 432. The shielding rings 431 are spaced apart from each other, are disposed on the front side 411 of the circuit board 41, and adjacently surround the touch contacts 421, respectively. The rear shielding plate 432 is disposed on the rear Side 412, s electrically connected to the shielding rings 431, and covers plural portions of the rear side 412 that correspond respectively to the portions of the front side 411 where the touch contacts 421 are disposed. Besides, the rear shielding plate 432 covers, with respect to each of the conducting wires 422 respectively of the touch switches 42, two sides of the conducting wire 422 along an extension path of the conducting wire 422. The shielding circuit 43 is configured to shield off interference from the reference ground of the circuit board 41 with the touch switches 42 by virtue of the circuit architecture design of the shielding circuit 43. In this embodiment, the rear shielding plate 432 is, but not limited to, a perforated mesh plate. Since creating the electrical connection between each shield rig ring 431 and the rear shielding plate 432, which are disposed respectively on opposite sides of the circuit board 41, is a conventional technique, details thereof will be omitted herein for the sake of brevity.

The control module 5 may include, but not limited to, a single core processor, a multi-core processor, a dual-core mobile processor, a microprocessor, a microcontroller, a digital signal processor (DSP), a field-programmable gate array (FPGA), an application specific integrated circuit (ASIC), and/or a radio-frequency integrated circuit (RFIC), etc.

The control module 5 includes a scan control unit 51 and a lock control unit 52. The scan control unit 51 can operate in an operation mode or a sleep mode, and stores a plurality of touch condition sets which are related to human contact and which correspond respectively to the touch switches 42. Each of the touch condition sets includes a plurality of touch conditions that are pre-established respectively in different weather conditions. Specifically, for each of the touch switches 42, the touch conditions are pre-established respectively on a sunny day, a rainy day, a stormy day, etc., by actually touching the touch switch 42 with a finger to obtain changes in voltage or capacitance relating to the touch switch 42, and the changes in voltage or capacitance that are obtained respectively in the different weather conditions serve respectively as the touch conditions for the touch switch 42.

When the scan control unit 51 operates in the operation mode, it will repeatedly execute an input scan operation on the touch panel 4 (for example, for a predetermined number of times) to scan each of the touch switches 42 individually and determine which one of the touch contacts 421 of the touch panel 4 is being operated by a human touch. When the scan control unit 51 operates in the sleep mode, it will execute an intermittent scan operation once every predetermined time interval to scan each of the touch switches 42 individually and determine whether the touch panel 4 is being operated (whether any one of the touch contacts of the touch panel is being operated by a human touch).

According to an embodiment, in each time of execution of the input/intermittent scan operation, the scan control unit 51 scans each of the touch switches 42 individually by transmitting a scan signal to the touch switch 42 to undercharge a self capacitor formed by coupling between the touch switch 42 and the reference ground of the circuit board 41, and transmitting a driving signal to the shielding circuit 43 to charge a mutual capacitor formed by coupling between the shielding circuit 43 and the touch switch 42. In this embodiment, the scan control unit 51 transmits the scan signal to the touch switch 42 to charge the self capacitor for a predetermined time duration in a manner that the self capacitor remains undercharged, and charges the mutual capacitor with the driving signal to make a high voltage level of the voltage of the mutual capacitor greater than the voltage of the self capacitor. In this embodiment, the scan signal is a constant current signal. During scanning of one of the touch switches 42, the scan control unit 51 determines whether an electric change relating to the self capacitor and the mutual capacitor conforms with any one of the touch conditions included in the corresponding one of the touch condition sets.

When the scan control unit 51 operates in the sleep mode and executes the intermittent scan operation, the scan control unit 51 determines that one of the touch switches 42 is touched by a human and switches to the operation mode if the electric change conforms with one of the touch conditions in the corresponding one of the touch condition sets; otherwise, the scan control unit 51 will stay in the sleep mode. When the scan control unit 51 operates in the operation mode and repeatedly executes the input scan operation, it will determine that one of the touch switches 42 is touched and generate a touch signal corresponding to the touch switch 42 if the electric change conforms with one of the touch conditions in the corresponding one of the touch condition sets.

In this embodiment, the scan control unit 51 transmits a square-wave signal as the driving signal to the shielding circuit 43 to charge the mutual capacitor to make the voltage of the mutual capacitor switch between the high voltage level (e.g., 5 V) that is higher than the voltage of the self capacitor and a low voltage level (e.g., 0 V) that is lower than the voltage of the self capacitor. Besides, the scan control unit 51 will obtain a change in a first voltage difference between a charged voltage of the self capacitor that has been charged by the scan signal and the high voltage level, and a change in a second voltage difference between the charged voltage of the self capacitor and the low voltage level. The change in the first voltage difference and the change in the second voltage difference together serve as the electric change. The scan control unit 51 will determine whether the change in the first voltage difference and the change in the second voltage difference conform with any one of the touch conditions included in the corresponding one of the touch condition sets that corresponds to the touch switch 42. If the changes in the first and second voltage differences conform with any one of the touch conditions, the scan control unit 51 will switch to the operation mode when the scan control unit 51 currently operates in the sleep mode, or generate the touch signal that corresponds to the touch switch 42 when the scan control unit 51 currently operates in the operation mode.

When the touch contact 421 of the touch switch 42 is not in contact with water and is not in contact with a human body, the capacitance of the self capacitor and the capacitance of the mutual capacitor are approximately constant. Therefore, the self capacitor will be charged to a predetermined voltage (e.g., 4 V) after being charged for the predetermined time duration. In this case, the scan control unit 51 determines that the first and second voltage differences remain at predetermined values, respectively (e.g., 1 V and 4 V), and concludes that there is no change in the first voltage difference between the charging voltage of the self capacitor and the high voltage level (e.g., 5 V) of the mutual capacitor and no change in the second voltage difference between the charging voltage of the self capacitor and the low voltage level (e.g., 0 V) of the mutual capacitor.

When water is in contact with the touch contact 421 of one of the touch switches 42, the water is capacitively coupled to said one of the touch switches 42 and the shielding circuit 43, and is also capacitively coupled to the reference ground of the circuit board 41. The effect of the capacitive coupling increases the capacitance of the self capacitor; however, the capacitive coupling between water and the reference ground of the circuit board 41 is relatively weak (i.e., a coupling capacitor formed between water and the reference ground of the circuit board 41 has a relatively higher impedance). In consequence, since the scan control unit 51 charges the self capacitor by the constant current signal only for the predetermined time duration during each scan operation, the charged voltage of the self capacitor will drop (e.g., to 3 V) when water touches the touch contact 421, and then the first voltage difference and the second voltage difference will change, for example, to 2 V and 3 V, respectively.

When a human body touches the touch contact 421 of one of the touch switches 42, capacitive coupling occurs between the human body and said one of the touch switches 42 and between the human body and the shield circuit 43, and relatively strong capacitive coupling also occurs between the human body and the reference ground of the circuit board 41. Since the human body can be considered as a grounded capacitor, the contact of the human body will cause the capacitance of the self capacitor to increase significantly, by an amount more than the increase of the capacitance of the self capacitor the case of water contact, and simultaneously provide a discharge path between the mutual capacitor and the reference ground of the circuit board 41, causing the voltage of the mutual capacitor to drop to 0 V. In this case, since the scan control unit 51 charges the self capacitor by the constant current signal only for the predetermined time duration during each scan operation, the charged voltage of the self capacitor will drop significantly (e.g., to 1 V), and a voltage difference between the charged voltage of the self capacitor and the voltage of the mutual capacitor will be, for example, 1 V. That is to say, when the scan control unit 51 determines that the change in the first voltage difference and the change in the second voltage difference conform with the change described in this paragraph (e.g., the second voltage difference changing from 4 V to 1 V), it is determined that the electric change conforms with the touch condition. In addition, when the human body touches the touch contact 421 where there is water, the capacitance of the self capacitor will further increase, causing larger change in the voltage (difference between the charged voltage of the self capacitor and the voltage of the mutual capacitor.

According to another embodiment, in each time of execution of the input/intermittent scan operation, the scan control unit 51 scans each of the touch switches 42 individually by transmitting the scan signal to the touch switch 42 to charge the self capacitor formed by coupling between the touch switch 42 and the reference ground of the circuit board 41, and transmitting the driving signal to the shielding circuit 43 to charge the mutual capacitor formed by coupling between the shielding circuit 43 and the touch switch 42. In this embodiment, the scan control unit 51 charges the self capacitor with the scan signal to make a voltage of the self capacitor reach a predetermined voltage value, and charges the mutual capacitor with the driving signal to make a voltage of the mutual capacitor equal to the voltage of the self capacitor. When one of the touch switches 42 is scanned, the scan control unit 51 determines whether the electric change relating to the self capacitor and the mutual capacitor conforms with any one of the touch conditions included in the corresponding one of the touch condition sets. In this embodiment, the electric change is attributed to changes in capacitances of the self capacitor and mutual capacitor.

When the scan control unit 51 operates in the sleep mode and executes the intermittent scan operation, the scan control unit 51 determines that one of the touch switches 42 is touched by a human and switches to the operation mode if the electric change conforms with one of the touch conditions in the corresponding one of the touch condition sets; otherwise, the scan control unit 51 stays in the sleep mode. When the scan control unit 51 operates in the operation mode and repeatedly executes the input scan operation, it will determine that one of the touch switches 42 is being touched and generate a touch signal that corresponds to the touch switch 42 if the electric change conforms with one of the touch conditions in the corresponding one of the touch condition sets.

In this embodiment, the electric change is related to, but not limited to, an amount of charges applied by the scan signal to the self capacitor to charge the self capacitor to the predetermined voltage.

In this embodiment, as one of the touch switches 42 is being scanned, the capacitances of the self capacitor and the mutual capacitor are approximately constant when the touch contact 421 of said one of the touch switches 42 is not in contact with water and is not in contact with the human body. Therefore, the electric change obtained by measuring and analyzing the self capacitor and the mutual capacitor will remain approximately at a predetermined value with only slight variations.

When water is in contact with the touch contact 421 of one of the touch switches 42, the water is capacitively coupled to said one of the touch switches 42 and the shielding circuit 43, and is also capacitively coupled to the reference ground of the circuit board 41. The effect of the capacitive coupling increases the capacitance of the self capacitor and the capacitance of the mutual capacitor; however, the capacitive coupling between water and the reference ground of the circuit board 41 is relatively weak (i.e., a coupling capacitor formed between water and the reference ground of the circuit board 41 has a relatively higher impedance). In consequence, the amount of charges in the self capacitor, which should have been charged to the predetermined voltage value by the scan signal, is insufficient because of increase of the capacitance thereof, and the charges accumulated in the mutual capacitor may be transmitted to the self capacitor in a form of an electric current passing through the capacitive coupling circuit between the water and said one of the touch switches 42, so as to compensate for the insufficiency of the charges accumulated in the self capacitor. By virtue of the charge compensation mechanism of the mutual capacitor, an amount of charges (electrical energy) provided by the scan control unit 51 and used to charge the self capacitor will change only slightly in view of an increase in the capacitance of the self capacitor, regardless of the extent of the increase. Therefore, compared to the case that the touch switch 42 is not in contact with water or a human body, electric signals obtained respectively from the self capacitor and the mutual capacitor will simply change slightly (i.e., the electric change is slight) when water is in contact with the touch switch 42 while no human body is in contact with the touch switch 42.

When a human body touches the touch contact 421 of one of the touch switches 42, the capacitive coupling occurs between the human body and said one of the touch switches 42 and between the human body and the shield circuit 43, and relatively strong coupling also occurs between the human body and the reference ground of the circuit board

41. Since the human body can be considered a large grounded capacitor, contact of the human body with said one of the touch switches 42 will cause the capacitance of the self capacitor to increase significantly, and simultaneously provide a discharge path between the mutual capacitor and the reference ground of the circuit board 41. In this case, the mutual capacitor can no longer provide charges to the self capacitor, and the scan control unit 51 needs to output more charges (electrical energy) in order to charge the self capacitor to the predetermined voltage value. As a result, the electric signals obtained from the self capacitor and the mutual capacitor will be significantly different from the electric signals in the situation of contact with water but not human body (i.e., the electric change is significant in the case of contact with human body). When a human body touches the touch contact 421 where there is water, the capacitance of the self capacitor is increased by an amount greater than the case that the touch contact 421 is in contact with the human body but not water, which in turn will cause a relatively large change in the electric signals (i.e., the electric change in this case is greater than that in the case that the touch contact 421 is in contact with the human body but not water).

In any of the above embodiments, only when a human body is in contact with the touch contact 421 of one of the touch switches 42, regardless of whether or not there is also water contact, the electric change will be significantly different from the case where there is contact with water but not human body, so the scan control unit 51 is able to distinguish a human touch from a water contact, thereby preventing accidental triggering of the touch panel 4 by water.

In the above embodiments, for each of the touch switches 42, the electric changes relating respectively to contact with water but not human body, contact with human body but not water, and contact with both water and human body can be obtained in advance, and the human touch conditions, which are related to human contact and which correspond to the touch switch 42, can be established accordingly. Then, the scan control unit 51 in the sleep mode can determine whether one of the touch switches 42 is being operated by a human touch, and will switch to the operation mode when it is determined that the touch switch 42 is being operated by a human touch, so as to eliminate the problem that the touch panel 4 is accidently triggered by water contact with the touch panel 4.

The lock control unit 52 may pre-store one or more reference passwords, and receive a plurality of the touch signals within a predetermined time interval from the scan control unit 51 in the operation mode. Then, the lock control unit 52 composes an input password based on the touch signals that are generated respectively in different times of execution of the input scan operation. Once the input password is determined to be identical to one of the reference passwords, the lock control unit 52 will control the electric locking unit 3 to operate (e.g. to lock or unlock the door).

In summary, the control module 5 can more accurately determine whether the touch panel 4 is operated by human touch according to the touch condition sets corresponding respectively to the touch switches 42. The problem that the conventional electronic lock will be accidently triggered by water and switch from the sleep mode to the operation mode can be alleviated according to the embodiments of this disclosure. Therefore, the electronic lock of this disclosure can normally operate in a humid environment.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An electronic lock comprising:
   an electric locking unit;
   a touch panel including a circuit board that has a reference ground, a plurality of touch switches that are disposed on said circuit board, and a shielding circuit that is disposed on said circuit board around said touch switches for shielding said touch switches from the reference ground of said circuit board; and
   a control module including
      a scan control unit that is configured to store a plurality of touch condition sets which are related to human contact and which correspond respectively to said touch switches, and to operate in an operation mode to repeatedly execute an input scan operation on said touch panel, each of the touch condition sets including a plurality of touch conditions that are pre-established respectively in different weather conditions, wherein in each time of execution of the input scan operation, said scan control unit scans each of said touch switches individually by
         transmitting a scan signal to said touch switch to charge a self capacitor formed by coupling between said touch switch and the reference ground of said circuit board,
         transmitting a driving signal to said shielding circuit to charge a mutual capacitor formed by coupling between said shielding circuit and said touch switch,
         determining whether an electric change relating to the self capacitor and the mutual capacitor conforms with any one of the touch conditions included in the corresponding one of the touch condition sets, and
         generating a touch signal corresponding to said touch switch when it is determined that the electric change conforms with one of the touch conditions in the corresponding one of the touch condition sets, and
      a lock control unit that is configured to store a reference password, to receive the touch signal from said scan control unit, to compose an input password based on a plurality of the touch signals that are generated respectively in different times of execution of the input scan operation, to determine whether the input password is identical to the reference password, and to control said electric locking unit to operate when it is determined that the input password is identical to the reference password.

2. The electronic lock of claim 1, wherein, in each time of execution of the input scan operation, said scan control unit scans each of said touch switches by:

charging the self capacitor with the scan signal to make a voltage of the self capacitor reach a predetermined voltage value;

charging the mutual capacitor with the driving signal to make a voltage of the mutual capacitor equal to the voltage of the self capacitor;

determining whether the electric change conforms with any one of the touch conditions included in the corresponding one of the touch condition sets; and generating the touch signal that corresponds to said touch switch when it is determined that the electric change conforms with one of the touch conditions in the corresponding one of the touch condition sets.

3. The electronic lock of claim 2, wherein the electric change s attributed to changes in capacitances of the self capacitor and mutual capacitor.

4. The electronic lock of claim 1, wherein, in each time of execution of the input scan operation, said scan control unit scans each of said touch switches by:

transmitting a constant current signal as the scan signal to said touch switch to charge the self capacitor for a predetermined time duration in a manner that the self capacitor remains undercharged;

transmitting a square-wave signal as the driving signal to said shielding circuit to charge the mutual capacitor to make a voltage of the mutual capacitor switch between a high voltage level and a low voltage level;

obtaining a change in a first voltage difference between a charged voltage of the self capacitor that has been charged by the scan signal and the high voltage level and a change in a second voltage difference between the charged voltage of the self capacitor and the low voltage level, the change in the first voltage difference and the change in the second voltage difference cooperatively serving as the electric change;

determining whether the change in the first voltage difference and the change in the second voltage difference conform with any one of the touch conditions included in the corresponding one of the touch condition sets; and generating the touch signal that corresponds to said touch switch when it is determined that the change in the first voltage difference and the change in the second voltage difference conform with one of the touch conditions in the corresponding one of the touch condition sets.

5. The electronic lock of claim 1, wherein said scan control unit is further configured to operate in a sleep mode to execute an intermittent scan operation once every predetermined time interval to scan each of said touch switches individually by:

transmitting the scan signal to said touch switch to charge the self capacitor;

transmitting the driving signal to said shielding circuit to charge the mutual capacitor;

determining whether the electric change relating to the self capacitor and the mutual capacitor conforms with any one of the touch conditions included in the corresponding one of the touch condition sets; and switching to the operation mode when it is determined in the sleep mode that the electric change conforms with one of the touch conditions in the corresponding one of the touch condition sets.

6. The electronic lock of claim 1, wherein said circuit board has a front side and a rear side that are opposite to each other, wherein each of said touch switches includes a touch contact disposed on said front side and configured to detect touch operation, and a conducting wire disposed on said rear side and electrically connecting said touch contact to said control module, and said touch contacts respectively of said touch switches are disposed respectively at different portions of said front side, wherein said shielding circuit includes a plurality of shielding rings disposed on said front side and surrounding said touch contacts respectively, and a rear shielding plate disposed on said rear side, electrically connected to said shielding rings, covering plural portions of said rear side that correspond respectively to the portions of said front side where said touch contacts are disposed, and covering, with respect to each of said conducting wires respectively of said touch switches, two sides of said conducting wire along an extension path of said conducting wire.

7. The electronic lock of claim 6, wherein said rear shielding plate is a perforated mesh plate.

8. An electronic lock comprising:

an electric locking unit;

a touch panel including a circuit board that has a reference ground, a plurality of touch switches that are disposed on said circuit board, and a shielding circuit that is disposed on said circuit board around said touch switches for shielding said touch switches from the reference ground of said circuit board; and a control module including a scan control unit that is configured to store a plurality of touch condition sets which are related to human contact and which correspond respectively to said touch switches, each of the touch condition sets including a plurality of touch conditions that are pre-established respectively in different weather conditions, said control module being further configured to operate in one of an operation mode where said control module is configured to control said electric locking unit to operate, and a sleep mode where said scan control unit executes an intermittent scan operation once every predetermined time interval, wherein, in each time of execution of the intermittent scan operation, said scan control unit scans each of said touch switches individually by transmitting a constant current signal to said touch switch to charge a self capacitor formed by coupling between said touch switch and the reference ground of said circuit board for a predetermined time duration in a manner that the self capacitor remains undercharged, transmitting a driving signal to said shielding circuit to charge a mutual capacitor formed by coupling between said shielding circuit and said touch switch to make a high voltage level of a voltage of the mutual capacitor greater than a voltage of the self capacitor, determining whether an electric change relating to the self capacitor and the mutual capacitor conforms with anyone of the touch conditions included in the corresponding one of the touch condition sets, and switching to the operation mode when it is determined in the sleep mode that the electric change conforms with one of the touch conditions in the corresponding one of the touch condition sets.

9. The electronic lock of claim 8, wherein, in each time of execution of the intermittent scan operation, said scan control unit scans each of said touch switches by:
transmitting a square-wave signal as the driving signal to said shielding circuit to charge the mutual capacitor to make the voltage of the mutual capacitor switch be the high voltage level and a low voltage level;
obtaining a change in a first voltage difference between the voltage of the self capacitor that has been charged by the constant current signal and the high voltage level and change in a second voltage difference between the charged voltage of the self capacitor and the low voltage level, the change in the first voltage difference and the change in the second voltage difference cooperatively serving as the electric change;
determining whether the change in the first voltage difference and the change in the second voltage difference conform with any one of the touch conditions included in the corresponding one of the touch condition sets; and
generating the touch signal that corresponds to said touch switch when it is determined that the change in the first voltage difference and the change in the second voltage difference conform with one of the touch conditions in the corresponding one of the touch condition sets.

10. The electronic lock of claim 8, wherein said scan control unit is further configured, in the operation mode, to repeatedly execute an input scan operation on said touch panel, and in each time of execution of the input scan operation, said scan control unit scans each of said touch switches individually by:
transmitting the constant current signal to said touch switch to charge the self capacitor for the predetermined time duration in a manner that the self capacitor remains undercharged;
transmitting the driving signal to said shielding circuit to charge the mutual capacitor to make the high voltage level of the voltage of the mutual capacitor greater than the voltage of the self capacitor;
determining whether the electric change relating to the self capacitor and the mutual capacitor conforms with any one of the touch conditions included in the corresponding one of the touch condition sets; and
generating a touch signal that corresponds to said touch switch when it is determined that the electric change conforms with one of the touch conditions in the corresponding one of the touch condition sets.

11. The electronic lock of claim 10, wherein said control module further includes a lock control unit that is configured to store a reference password, to receive the touch signal from said scan control unit, to compose an input password based on a plurality of the touch signals that are generated respectively in different times of execution of the input scan operation, to determine whether the input password is identical to the reference password, and to control said electric locking unit to operate when it is determined that the input password is identical to the reference password.

12. The electronic lock of claim 8, wherein said circuit board has a front side and a rear side that are opposite to each other,
wherein each of said touch switches includes a touch contact disposed on said front side and configured to detect touch operation, and a conducting wire disposed on said rear side and electrically connecting said touch contact to said control module, and said touch contacts respectively of said touch switches are disposed respectively at different portions of said front side,
wherein said shielding circuit includes a plurality of shielding rings disposed on said front side and surrounding said touch contacts respectively, and a rear shielding plate disposed on said rear side, electrically connected to said shielding rings, covering plural portions of said rear side that correspond respectively to the portions of said front side where said touch contacts are disposed, and covering, with respect to each of said conducting wires respectively of said touch switches, two sides of said conducting wire along an extension path of said conducting wire.

13. The electronic lock of claim 12, wherein said rear shielding plate is a perforated mesh plate.

14. An electronic lock comprising:
an electric locking unit;
a touch panel including a circuit board that has a reference ground, a plurality of touch switches that are disposed on said circuit board, and a shielding circuit that is disposed on said circuit board around said touch switches for shielding said touch switches from the reference ground of said circuit board; and
a control module including a scan control unit that is configured to store a plurality of touch condition sets which are related to human contact and which correspond respectively to said touch switches, each of the touch condition sets including a plurality of touch conditions that are pre-established respectively in different weather conditions, said control module being further configured to operate in one of an operation mode where said control module is configured to control said electric locking unit to operate, and a sleep mode where said scan control unit executes an intermittent scan operation once every predetermined time interval,
wherein, in each time of execution of the intermittent scan operation, said scan control unit scans each of said touch switches individually by
transmitting a scan signal to said touch switch to charge a self capacitor formed by coupling between said touch switch and the reference ground of said circuit board so as to make a voltage of the self capacitor reach a predetermined voltage value,
transmitting a driving signal to said shielding circuit to charge a mutual capacitor formed by coupling between said shielding circuit and said touch switch so as to make a voltage of the mutual capacitor equal to the voltage of the self capacitor,
determining whether an electric change relating to the self capacitor and the mutual capacitor conforms with any one of the touch conditions included in the corresponding one of the touch condition sets, and
switching to the operation mode when it is determined in the sleep mode that the electric change conforms with one of the touch conditions in the corresponding one of the touch condition sets.

15. The electronic lock of claim 14, wherein the electric change is attributed to changes in capacitances of the self capacitor and mutual capacitor.

16. The electronic lock of claim 14, wherein said scan control unit is further configured, in the operation mode, to repeatedly execute an input scan operation on said touch panel, and in each time of execution of the input scan operation, said scan control unit scans each of said touch switches individually by:

transmitting the scan signal to said touch switch to charge the self capacitor so as to make a voltage of the self capacitor reach a predetermined voltage value;

transmitting the driving signal to said shielding circuit to charge the mutual capacitor so as to make the voltage of the mutual capacitor equal to the voltage of the self capacitor;

determining whether the electric change relating to the self capacitor and the mutual capacitor conforms with any one of the touch conditions included in the corresponding one of the touch condition sets; and generating a touch signal that corresponds to said touch switch when it is determined that the electric change conforms with one of the touch conditions in the corresponding one of the touch condition sets.

17. The electronic lock of claim 16, wherein said control module further includes a lock control unit that is configured to store a reference password, to receive the touch signal from said scan control unit, to compose an input password based on a plurality of the touch signals that are generated respectively in different times of execution of the input scan operation, to determine whether the input password is identical to the reference password, and to control said electric locking unit to operate when it is determined that the input password is identical to the reference password.

18. The electronic lock of claim 14, wherein said circuit board has a front side and a rear side that are opposite to each other, wherein each of said touch switches includes a touch contact disposed on said front side and configured to detect touch operation, and a conducting wire disposed on said rear side and electrically connecting said touch contact to said control module, and said touch contacts respectively of said touch switches are disposed respectively at different portions of said front side, wherein said shielding circuit includes a plurality of shielding rings disposed on said front side and surrounding said touch contacts respectively, and a rear shielding plate disposed on said rear side, electrically connected to said shielding rings, covering plural portions of said rear side that correspond respectively to the portions of said front side where said touch contacts are disposed, and covering, with respect to each of said conducting wires respectively of said touch switches, two sides of said conducting wire along an extension path of said conducting wire.

19. The electronic lock of claim 18, wherein said rear shielding plate is a perforated mesh plate.

\* \* \* \* \*